US008731867B2

(12) United States Patent
Li et al.

(10) Patent No.: US 8,731,867 B2
(45) Date of Patent: May 20, 2014

(54) SYSTEM AND METHOD FOR MEASURING PERFORMANCE OF ELECTRONIC PRODUCTS

(75) Inventors: Shen-Chun Li, Tu-Cheng (TW); Hsien-Chuan Liang, Tu-Cheng (TW); Shou-Kuo Hsu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 451 days.

(21) Appl. No.: 13/085,429

(22) Filed: Apr. 12, 2011

(65) Prior Publication Data
US 2012/0016637 A1 Jan. 19, 2012

(30) Foreign Application Priority Data

Jul. 15, 2010 (TW) .............................. 99123360 U

(51) Int. Cl.
*G06F 11/30* (2006.01)
(52) U.S. Cl.
USPC ........... 702/182; 702/183; 702/184; 702/185; 702/188; 702/189
(58) Field of Classification Search
USPC ........... 702/182–185, 188, 189; 324/539, 543
See application file for complete search history.

(56) References Cited

U.S. PATENT DOCUMENTS 7,277,822 B2 * 10/2007 Blemel .......................... 702/183
7,733,491 B2 * 6/2010 Kuroda et al. ................. 356/445

FOREIGN PATENT DOCUMENTS

CN    101241162 A    8/2008

* cited by examiner

*Primary Examiner* — Elias Desta
(74) *Attorney, Agent, or Firm* — Altis Law Group, Inc.

(57) ABSTRACT

A system and method for measuring performance of an electronic product using a measurement control device that connects to a measuring machine and a display device. A component of the electronic product is determined according to a coordinate array, and a physical factor of the component to measured is determined according to performance specifications of the electronic product. A sensor corresponding to the physical factor of the component is selected from sensors of the measuring machine, and a physical factor of each the component is measured by the selected sensor. The system indicates whether the electronic product is workable or unworkable by comparing the physical factors of the components with the performance specifications of the components, and generates a measurement report for evaluating the performance of the electronic product according to the indication results.

18 Claims, 3 Drawing Sheets

SYSTEM AND METHOD FOR MEASURING PERFORMANCE OF ELECTRONIC PRODUCTS

BACKGROUND

1. Technical Field

Embodiments of the present disclosure relate to quality control systems and methods of electronic products, and particularly to a system and method for measuring performance of an electronic product.

2. Description of Related Art

Electronic products produced by assembly lines are frequently tested and/or monitored in order to determine whether performance of the electronic products are being within specified specifications. Most types of measurement systems attempt to measure performance parameters that are indicative of the performance of the electronic products; it is common in a traditional measurement system to manually evaluate the performance of the electronic products by operators. Accordingly, it is inconvenient for the operators to use the traditional measurement system to evaluate the performance of the electronic products, and the evaluation results on the performance of the electronic products may be inaccurate.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

As used herein, the term "physical factor" of an electronic product is defined as performance parameters for evaluating the performance of the electronic product, and may include, but are not limited to, a stress factor, a power factor, and a temperature factor. The electronic product may include one or more components, which may be resistors, capacitors, inductors, transistors, power supplies, and integrated circuits, for example.

Figure 1:
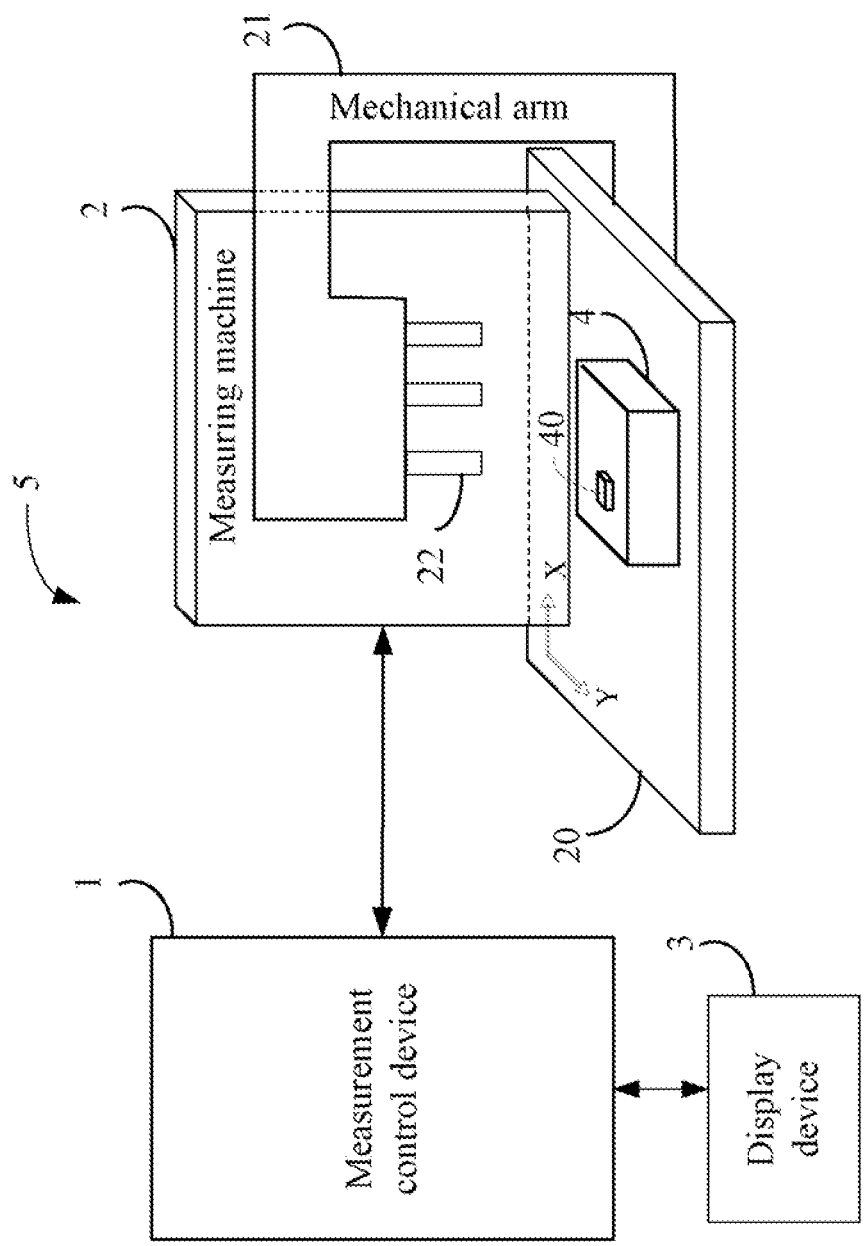
FIG. 1 is a block diagram of one embodiment of a system for measuring performance of electronic products.

FIG. 1 is a schematic diagram of one embodiment of a system for measuring performance of electronic products (hereinafter "the measurement system 5"). In the embodiment, the measurement system 5 includes a measurement control device 1, a measuring machine 2, and a display device 3. It should be understood that FIG. 1 illustrates only one example of the measurement system 5, and may include more or fewer components than illustrated, or a different configuration of the various components in other embodiments.

The measurement control device 1 electronically connects to the measuring machine 2, and connects to the display device 3. The measurement control device 1 can be, for example, as a desktop computer, a notebook computer, a server, a workstation, or any other computing device that includes various function modules (shown in FIG. 2). The measurement control device 1 measures a plurality of physical factors of an electronic product 4 located on the measuring machine 2.

The measurement system 5 further includes a platform 20, a mechanical arm 21, and one or more sensors 22. Each of the sensors 22 measure one of the physical factors of an electronic product 4 that is located on the platform 20. In one example of the embodiment, the electronic product 4 is a computer motherboard that includes one or more components, which may be resistors, capacitors, inductors, transistors, and power supplies. The mechanical arm 21 controls each of the sensors 22 to a position of a component to be measured. According to the physical factors of the electronic product 4, the sensors 22 may include a stress sensor, a power sensor, and a temperature sensor. Each of the sensors 22 measures a corresponding physical factor. For example, the stress sensor measures a stress factor of the measured component, the power sensor measures a power factor of the measured component, and the temperature sensor measures a temperature factor of the measured component.

Figure 2:
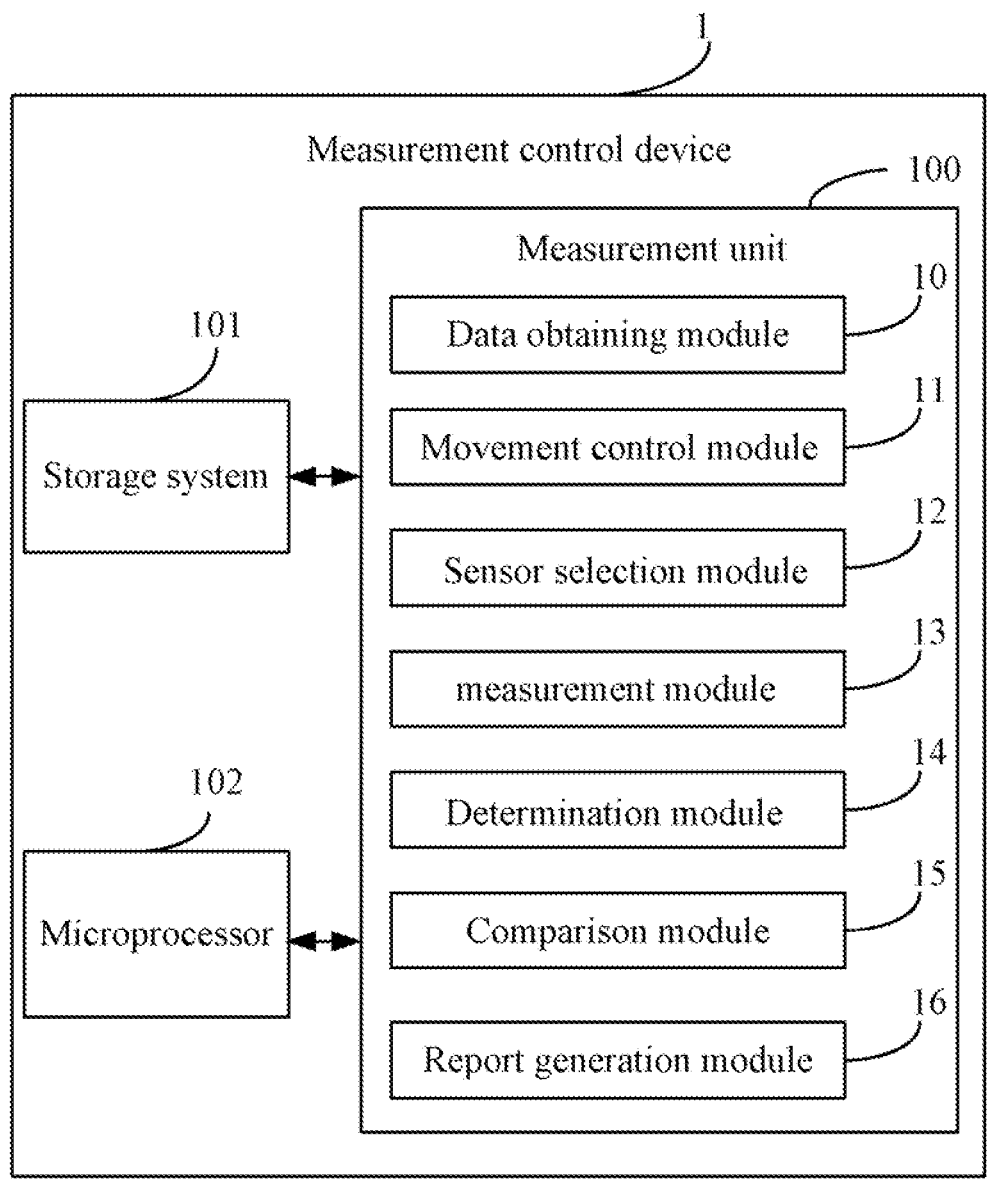
FIG. 2 is a block diagram illustrating one embodiment of a measurement control device included in the system of FIG. 1.

FIG. 2 is a block diagram of one embodiment of the measurement control device 1 included in the measurement system 5 of FIG. 1. The measurement control device 1 may include a measurement unit 100, a storage system 101, and at least one microprocessor 102. In one embodiment, the storage system 101 may be an internal storage system, such as a random access memory (RAM) for temporary storage of information, and/or a read only memory (ROM) for permanent storage of information. In some embodiments, the storage system 101 may also be an external storage system, such as an external hard disk, a storage card, or a data storage medium.

The database system 101 stores a coordinate array of the components, and data on each of the components of the electronic product 4, such as component names, component types, and performance specifications of the components. The coordinate array may include a coordinate value of each of the components according to a location of the component in the electronic product 4. In one embodiment, the coordinate values may be defined as (0,0), (0,1), (1,0), and (1,1) according to the locations of components in the electronic product 4.

In the embodiment, the measurement unit 100 includes a data obtaining module 10, a movement control module 11, a sensor selection module 12, a measurement module 13, a determination module 14, a comparison module 15, and a report generation module 16. The modules 10-16 may comprise computerized code in the form of one or more programs that are stored in the storage system 101. The computerized code includes instructions that are executed by the at least one microprocessor 102 to provide functions for implementing the modules. In general, the word "module," as used herein, refers to logic embodied in hardware or firmware, or to a collection of software instructions, written in a program language. In one embodiment, the program language may be Java or C. One or more software instructions in the modules may be embedded in firmware, such as an EPROM. The modules described herein may be implemented as either software and/or hardware modules and may be stored in any type of non-transitory computer-readable medium or other storage system.

The data obtaining module 10 is operable to search a coordinate value from the coordinate array stored in the storage system 101, and determine a component to be measured of the electronic product 4 according to the coordinate value. In the example, if the coordinate value (0,0) is searched from the coordinate array, the data obtaining module 10 indicates that the component is a resistor.

The data obtaining module 10 is further operable to obtain performance specifications of the components stored in the storage system 101, and determine a physical factor of the measured component according to the performance specifications. In one embodiment, the physical factor may be a stress factor, a power factor, or a temperature factor. For example, if the performance specification of the component is a stress specification, the data obtaining module 10 indicates that the physical factor to be measured is the stress factor.

The movement control module 11 is operable to control the mechanical arm 21 of the measuring machine 2 to move to a position of the component of the electronic product 4 according to the coordinate value.

The sensor selection module 12 is operable to select one of the sensors 22 according to the physical factor of the measured component, and control the selected sensor 22 to touch the position of the measured component during the movement of the mechanical arm 21. In the embodiment, the sensors 22 may include a stress sensor, a power sensor, and a temperature sensor. For example, if the physical factor is the stress factor, the sensor selection module 12 selects the stress sensor from the sensors 22, and control the stress sensor to touch the position of the measured component using the mechanical arm 21.

The measurement module 13 is operable to measure a physical value of the measured component using the selected sensor 22, and stores the physical value as the physical factor of the component into the storage system 101. Depending on the example, if the physical factor is the stress factor, the stress sensor measures a stress value of the component that can be supported, and stores the stress value into the storage system 101.

The determination module 14 is operable to determine whether all physical factors of the component have been measured according to the performance specification of the component, and determine whether all the components of the electronic product 4 have been measured by searching the coordinate values from the coordinate array of the electronic product 4. In the embodiment, all of the components have been measured until the coordinate values of the coordinate array have been completely searched by the data obtaining module 10.

The comparison module 15 is operable to compare the measured physical factor of each component with a corresponding performance specification of the component stored in the storage system 101, to indicate whether the electronic product 4 is workable or unworkable. In the embodiment, if all the measured physical factors of the components comply with the performance specifications of the components, the comparison module 15 indicates that the electronic product 4 is workable. If any measured physical factor of the components does not comply with the performance specifications of the components, the comparison module 15 indicates that the electronic product 4 is unworkable.

The report generation module 16 is operable to generate a measurement report for evaluating the performance of the electronic product 4 according to the indication results, and display the measurement report the on the display device 3, or store the measurement report into the storage system 101.

Figure 3:
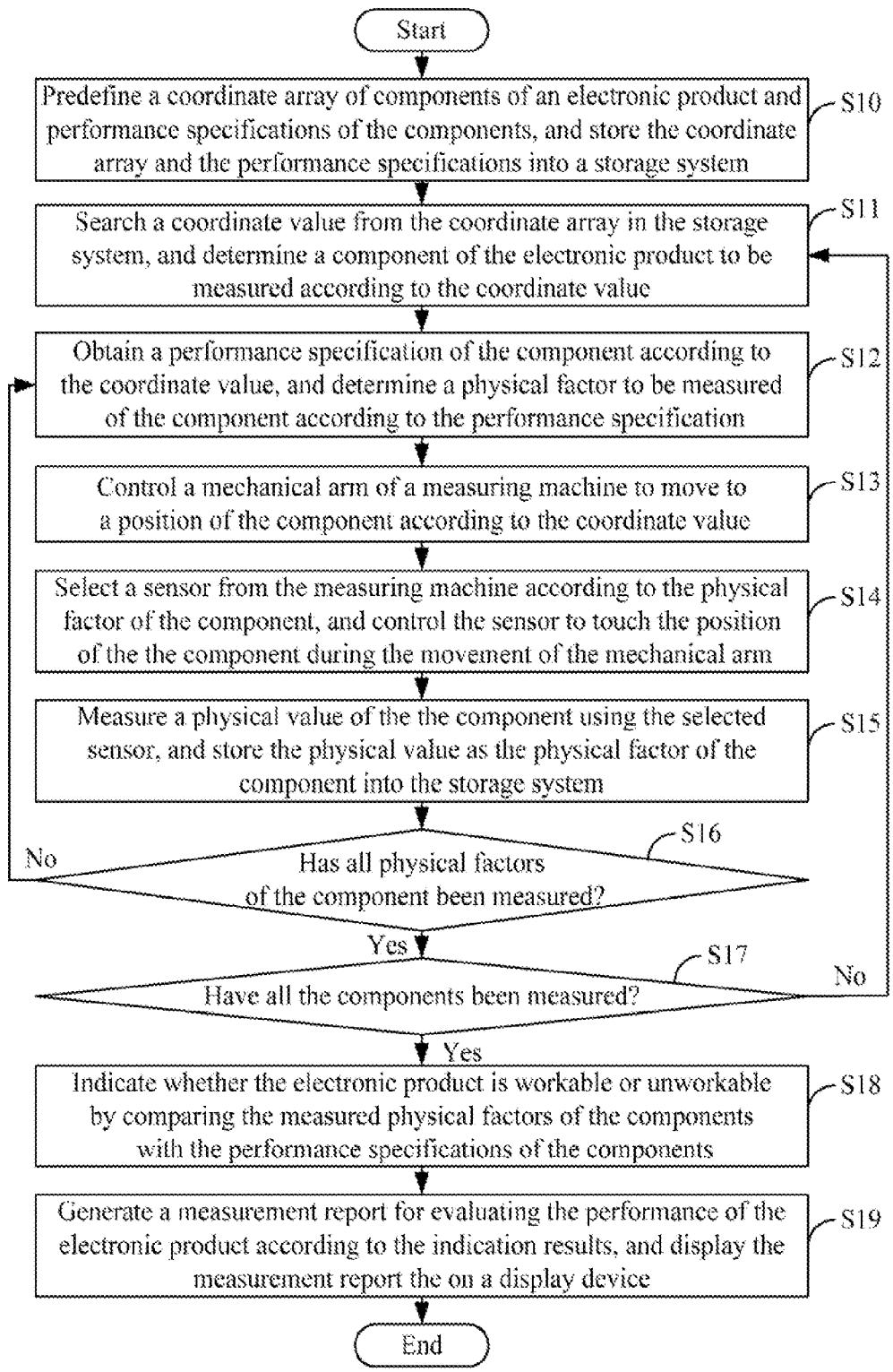
FIG. 3 is a flowchart of one embodiment of a method for measuring performance of electronic products implementing the system of FIG. 1.

FIG. 3 is a flowchart of one embodiment of a method for measuring performance of an electronic product implemented by the system 5 of FIG. 1. Depending on the embodiment, additional blocks may be added, others removed, and the ordering of the blocks may be changed.

In block S10, the data obtaining module 10 predefines a coordinate array of components of the electronic product 4 and performance specifications of components of the electronic product 4, and stores the coordinate array and the performance specifications into the storage system 101. The coordinate array stores a plurality of coordinate values of the components that are located on the electronic product 4. For example, a resistor is located on an center point of the electronic product 4, a coordinate value of the resistor may be defined as (0,0), and the coordinate value is stored in the coordinate array in the storage system 101.

In block S11, the data obtaining module 10 searches a coordinate value from the coordinate array in the storage system 101, and determines a component of the electronic product to be measured according to the coordinate value. In the example, if the coordinate value (0,0) is searched from the coordinate array, the data obtaining module 10 indicates that the component is a resistor.

In block S12, the data obtaining module 10 obtains a performance specification of the component according to the coordinate value, and determines a physical factor to be measured of the component according to the performance specification. In one embodiment, the physical factor may be a stress factor, a power factor, or a temperature factor. For example, if the performance specification of the component is a stress specification, the data obtaining module 10 indicates that the physical factor to be measured is a stress factor of the component.

In block S13, the movement control module 11 controls the mechanical arm 21 of the measuring machine 2 to move to a position of the component of the electronic product 4 according to the coordinate value.

In block S14, the sensor selection module 12 selects one of the sensors 22 from the measuring machine 3 according to the physical factor of the component, and controls the selected sensor 22 to touch the position of the component during the movement of the mechanical arm 21. In the embodiment, the sensors 22 may include a stress sensor, a power sensor, and a temperature sensor. For example, if the physical factor is the stress factor, the sensor selection module 12 selects the stress sensor from the sensors 22, and control the stress sensor to touch the position of the component using the mechanical arm 21.

In block S15, the measurement module 13 measures a physical value of the component using the selected sensor 22, and stores the physical value as the physical factor of the component into the storage system 101. Depending on the example, if the physical factor is the stress factor, the stress sensor measures a stress value of the component that can be supported, and stores the stress value into the storage system 101.

In block S16, the determination module 14 determines whether all physical factors of the component have been measured according to the performance specification of the component. If all the physical factors of the component been measured have been measured, block S17 is implemented. If any physical factor of the component has not been measured, block S12 is repeated.

In block S17, the determination module 14 determines whether all the components of the electronic product 4 have been measured by searching the coordinate values from the coordinate array of the electronic product 4. In the embodiment, all of the components have been measured until the coordinate values of the coordinate array have been completely searched by the data obtaining module 10. If all the components of the electronic product 4 have been measured, block S18 is implemented. Otherwise, if any component of the electronic product 4 has not been measured, block S11 is repeated.

In block S18, the comparison module 15 compares the measured physical factors of the components with performance specifications of the components, to indicate whether the electronic product is workable or unworkable. In the embodiment, if all the measured physical factors of the components comply with the performance specifications of the components, the comparison module 15 indicates that the electronic product 4 is workable. If any measured physical factor of the components does not comply with the performance specifications of the components, the comparison module 15 indicates that the electronic product 4 is unworkable.

In block S19, the report generation module 16 generates a measurement report for evaluating the performance of the electronic product 4 according to the indication results, and displays the measurement report the on the display device 3, or stores the measurement report into the storage system 101.

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. A computerized method for measuring performance of an electronic product located on a measuring machine, the measuring machine electronically connected to a measurement control device and a display device, the method being performed by execution of computerized instructions by at least one microprocessor of the measurement control device, the method comprising:

predefining a coordinate array of components of the electronic product and performance specifications of the components, and storing the coordinate array and the performance specifications of the components into a storage system of the measurement control device;

searching a coordinate value from the coordinate array stored in the storage system, and determining a measured component of the electronic product according to the coordinate value;

obtaining a performance specification of the component from the storage system, and determining a physical factor of the component according to the performance specification;

selecting a sensor corresponding to the physical factor of the component from a plurality of sensors of the measuring machine, and controlling the selected sensor to touch a position of the component by a mechanical arm of the measuring machine;

measuring a physical value of each of the components using the selected sensor, and storing the physical values as physical factors of the components into the storage system;

indicating whether the electronic product is workable or unworkable by comparing the physical factors of the components with the performance specifications of the components; and generating a measurement report for evaluating the performance of the electronic product according to the indication results, and displaying the measurement report on the display device.

2. The method according to claim 1, further comprising: controlling the mechanical arm to move to the position of the component according to the coordinate value.

3. The method according to claim 1, further comprising: determining whether all the physical factors of the component have been measured according to the performance specification of the component; and repeating the obtaining step to the measuring step until all the physical factors of the component have been measured.

4. The method according to claim 1, further comprising: determining whether all the components of the electronic product have been measured by searching the coordinate values from the coordinate array; and repeating the searching step to the measuring step until all the components of the electronic product have been measured.

5. The method control device according to claim 1, wherein the physical factors comprise a stress factor, a power factor, and a temperature factor.

6. The method control device according to claim 1, wherein the sensors comprise a stress sensor, a power sensor, and a temperature sensor.

7. A measurement control device for measuring performance of an electronic product, the measurement control device electronically connected to a measuring machine and a display device, the measurement control device comprising:

at least one microprocessor;

a storage system operable to a coordinate array of components of the electronic product, and performance specifications of the components; and one or more programs stored in the storage system and executable by the at least one microprocessor, the one or more programs comprising:

a data obtaining module operable to search a coordinate value from the coordinate array stored in the storage system, determine a measured component of the electronic product according to the coordinate value, obtain a performance specification of the component from the storage system, and determine a physical factor of the component according to the performance specifications;

a sensor selection module operable to select a sensor corresponding to the physical factor of the component from a plurality of sensors of the measuring machine, and control the selected sensor to touch a position of the component by a mechanical arm of the measuring machine;

a measurement module operable to measure a physical value of each of the components using the selected sensor, and store the physical values as physical factors of the components into the storage system;

a comparison module operable to indicate whether the electronic product is workable or unworkable by comparing the physical factors of the components with the performance specifications of the components; and a report generation module operable to generate a measurement report for evaluating the performance of the electronic product according to the indication results, and display the measurement report on the display device.

8. The measurement control device according to claim 7, wherein the one or more programs further comprises a movement control module operable to control the mechanical arm to move to the position of the component according to the coordinate value.

9. The measurement control device according to claim 7, wherein the one or more programs further comprises a determination module operable to determine whether all the physical factors of the component have been measured according to the performance specification of the component, and determine whether all the components of the electronic product have been measured by searching the coordinate values from the coordinate array.

10. The measurement control device according to claim 7, wherein the physical factors comprise a stress factor, a power factor, and a temperature factor.

11. The measurement control device according to claim 7, wherein the sensors comprise a stress sensor, a power sensor, and a temperature sensor.

12. The measurement control device according to claim 7, the comparison module indicates that the electronic product is workable if all the physical factors of the components comply with the performance specifications of the components.

13. A non-transitory computer-readable storage medium having stored thereon instructions that, when executed by at least one microprocessor of a computing device that electronically connects to a measuring machine and a display device, causes the computing device to perform a method for measuring performance of an electronic product, the method comprising:
    predefining a coordinate array of components of the electronic product and performance specifications of the components, and storing the coordinate array and the performance specifications of the components into a storage system of the computing device;
    searching a coordinate value from the coordinate array stored in the storage system, and determining a measured component of the electronic product according to the coordinate value;
    obtaining a performance specification of the component from the storage system, and determining a physical factor of the component according to the performance specification;
    selecting a sensor corresponding to the physical factor of the component from a plurality of sensors of the measuring machine, and controlling the selected sensor to touch a position of the component by a mechanical arm of the measuring machine;
    measuring a physical value of each of the components using the selected sensor, and storing the physical values as physical factors of the components into the storage system;
    indicating whether the electronic product is workable or unworkable by comparing the physical factors of the components with the performance specifications of the components; and
    generating a measurement report for evaluating the performance of the electronic product according to the indication results, and displaying the measurement report on the display device.

14. The non-transitory computer-readable storage medium according to claim 13, wherein the method further comprises:
    controlling the mechanical arm to move to the position of the component according to the coordinate value.

15. The non-transitory computer-readable storage medium according to claim 13, wherein the method further comprises:
    determining whether all the physical factors of the component have been measured according to the performance specification of the component; and
    repeating the obtaining step to the measuring step until all the physical factors of the component have been measured.

16. The non-transitory computer-readable storage medium according to claim 13, wherein the method further comprises:
    determining whether all the components of the electronic product have been measured by searching the coordinate values from the coordinate array; and
    repeating the searching step to the measuring step until all the components of the electronic product have been measured.

17. The non-transitory computer-readable storage medium according to claim 13, wherein the physical factors comprise a stress factor, a power factor, and a temperature factor.

18. The non-transitory computer-readable storage medium according to claim 13, wherein the sensors comprise a stress sensor, a power sensor, and a temperature sensor.

* * * * *